(12) United States Patent
Tai et al.

(10) Patent No.: US 6,190,947 B1
(45) Date of Patent: Feb. 20, 2001

(54) SILICON SEMICONDUCTOR RECTIFIER CHIPS AND MANUFACTURING METHOD THEREOF

(75) Inventors: Chao-Chih Tai, Hsin-Tien; El Pon Jone; Huei-Jeng Tsai, both of Cha-yi, all of (TW)

(73) Assignee: Zowie Technology Corporation, Taipei (TW)

(*) Notice: Under 35 U.S.C. 154(b), the term of this patent shall be extended for 0 days.

(21) Appl. No.: 09/277,763

(22) Filed: Mar. 29, 1999

Related U.S. Application Data

(63) Continuation-in-part of application No. 08/929,679, filed on Sep. 15, 1997, now abandoned.

(51) Int. Cl.$^7$ .................. H01L 21/301; H01L 21/316
(52) U.S. Cl. ............................ 438/133; 438/460
(58) Field of Search .................... 438/109, 113, 438/114, 460, 465, 133, 134, 33, 38, 778, 787, 958

(56) References Cited

U.S. PATENT DOCUMENTS

| | | | | |
|---|---|---|---|---|
| 3,531,858 | * | 10/1970 | Lutz | 438/113 |
| 3,852,876 | * | 12/1974 | Sheldon et al. | 438/309 |
| 3,972,113 | * | 8/1976 | Nakata etal. | 438/540 |
| 4,133,690 | * | 1/1979 | Muller | 428/325 |
| 4,638,553 | * | 1/1987 | Nilard | 438/458 |
| 4,663,820 | * | 5/1987 | Ionescu | 438/753 |
| 4,904,610 | * | 2/1990 | Shyr | 438/464 |
| 5,401,690 | * | 3/1995 | Chen | 438/465 |
| 5,491,111 | * | 2/1996 | Tai | 438/113 |
| 5,550,086 | * | 8/1996 | Tai | 438/127 |
| 6,086,396 | * | 7/2000 | Huang | 438/400 |

FOREIGN PATENT DOCUMENTS

| | | | | |
|---|---|---|---|---|
| 55-44770 | * | 3/1980 | (JP) | 257/626 |
| 57-60844 | * | 4/1982 | (JP) | 438/FOR 387 |
| 61-15871 | * | 7/1986 | (JP) | 257/626 |
| 2-298073 | * | 12/1990 | (JP) | 257/626 |

\* cited by examiner

*Primary Examiner*—Savitri Mulpuri
(74) *Attorney, Agent, or Firm*—Rosenberg, Klein & Lee

(57) ABSTRACT

This invention is directed to a semiconductor rectifier chip comprised of a semiconductor dice with at least one P-N junction, and the entire cutting surface of the dice sealed a passivation glass to omite the use of a expansion plate. The rectifier chip is made of negative or positive silicon semiconductor wafer that has been subjected to standard wafer diffusion process to form $P^{30}$-N-$N^+$ or $N^+$-P-$P^+$ layer construction, then to cut into a plurality of dices which having a cutting surface, the cutting surface from $N^{30}$ to $P^+$ of the dice is sealing by the passivation glass to omite the use of the expansion plate, and the electrode ohmic contact metal for soft soldering or hard brazing purpose is made on both sides of the dice simultaneously.

4 Claims, 6 Drawing Sheets

SILICON SEMICONDUCTOR RECTIFIER CHIPS AND MANUFACTURING METHOD THEREOF

CROSS-REFERENCE TO RELATED APPLICATIONS

This application is a Continuation-In-Part of United States Patent Application "FULL OPEN JUNCTION GLASS PASSIVATED SILICON SEMICONDUCTOR DIODE CHIP", U.S. Ser. No. 08/929,679 filed Sep. 15, 1997, now abn., having chao-chih Tai et al. as inventors. The 08/929,679 application is hereby incorporated by reference in its entirety.

BACKGROUND OF THE INVENTION

1. Field of the Invention

This invention relates to a silicon semiconductor rectifier chip, and more specifically relates to a novel method for manufacture of a plurality of semiconductor rectifier chip to omit the use of an expansion plate.

2. Description of the Prior Art

For the production of silicon semiconductor rectifier chips, as described in U.S. Pat. No. 4,638,553, "METHOD OF MANFACTURE OF SEMICONDUCTOR DEVICE", to Anders Nilarp as inventor and assigned to International Rectifier Corporation, shown in FIGS. 1 and 2, the manufacturers would often adopt the most efficient standard diffusion method, to make the rectifier diode chips. The first step in the general production method is to diffuse the two sides of silicon wafer with dopant of five-valance element (such as phosphor, arsenic, etc.) and dopant of three-valance element (such as boron, aluminum, gallium, etc.), to form a P-N junction and a n-region 24 and a p-region (expansion plate 26 with low surface resistance, at step 101, the expansion plate 26 will be a molybdenum contact having the same diameter as a silicon semiconductor diode chip 20 and having a thickness from 30 to 120 mils, typically 60 mils. After then, the electrode surfaces of silicon wafer are plated with metal film (such as, nickel, aluminum, etc.) to form ohmic contact on the surface of the silicon wafer and enable it applicable to different types of bonding processes, such as nickel/gold plating for soft soldering, or aluminum for hard brazing, to join with conductive elements, at step 102.

After the silicon diode wafer is prepared, the wafer is cut into small chips 20 with a certain shape and size, according to the application of the diodes, at step 103. The open junction of the chips 20 is grinding the peripheral portions on the silicon diode chip 20 to produce round mesa shape and then is processed by chemical polish to remove the mechanical damages and coatamination caused by the separation cutting process, at step 104. A silicon dioxide film is formed on the silicon diode chip 20 so that the chip may possess good reverse electric properties. Forming a passivation coating 28, passivation and coating are then applied to the junction of the chip 20, at step 105. The final step is heat treating inherently dry the passivated the silicon diode chip 20 and the processing of the chip 20 is completed, at step 106.

With regard to the production of the rectifier chips, there are three categories of major conventional design and processing:

I) The semiconductor wafer is cut into chips, the chips are soldered with the electrical conducting elements, to become soldered sub-assembly, followed by chemical treatment and passivation in the chip cutting surface. Such as the sandwich cell construction, the axial lead plastic molded package, developed in the early stage of the industry. This category includes the "Sandwich Cell Construction", as developed by Westinghouse in the early days, and the "Axial Lead Plastic Molded Package" method etc.

II) The rectifier diode chips with aluminum film is cut into mesa shaped chips by sand blasting method. The chips are then subjected to low-temperature chemical etching with etched chip is than hard brazed to two electrodes, usually made of tungsten or molybdenum and copper lead wire. The lead mounted subassembly is then processed by secondary junction etching, passivation glass powder slurry coating and firing to form a bead shaped glass encapsulation over the electrodes-silicone chip portion. This approach was developed by General Electric and was patented in the United States.

III) After the wafer diffusion completed, photoresist etching agent is applied, to proceed with selective partial chemical etching, to make a etch groove from the p surface, so the P-N junction of each chip element is etched and exposed. The wafer is processed with passivation treatment and glass coating. The final manufacturing steps are metallization and chip separation cutting to obtain the glass passivated pellet, or shortened as GPP.

The GPP has better performance than sandwich cell construction, so the GPP is generally employed by all types of rectifier circuit modules, such as bridge rectifiers, small outline diode (shortened as SOD), etc. However, the configuration of open P/N junction of GPP is negative beveled, the passivation glass coating covers limited areas with constricted thickness. All these result in its reverse electrode performance not reaching the optimum levels. GPP also requires more silicone wafer area than its characteristical requirement to enable to process multi-unit in wafer form.

Furthermore, the chips made by this method will inevitably result in a quality risk of mechanical damage on the glass film during the cutting and separating process, and consequently, micro crack will occur, and the tension is concentrated. Such a circumstance, in operation, will become a quite serious operational failure source. Though the manufacturers have been trying very hard for the past decades, the efficiency of possible improvement on above defects is quite limited.

As previously discussed, one method employed to avoid that damages to the glass passivation layer during the cutting process in the GPP approach is described in U.S. Pat. No. 4,638,553 discussed above. Nevertheless, the method of Nilarp, in which the silicon semiconductor diode chip 20 are brazed layers having a thickness from 30 to 120 mils before the polishing step is carried out. The thickness of the expansion plate 26 would be required for sealing the passivation coating 28, otherwise, the cutting surfaces of the diode chip 20 cannot be sealed with a layer of passivation glass from N-region 24 to P-region without the expansion plate 26. The production costs are also high.

Therefore, a novel structure of silicon semiconductor diode chip and a new method to prepare the diode chip are continuously being sought to overcome the disatisfaction of the GPP approach and eliminate the expansion plate.

SUMMARY OF THE INVENTION

In accordance with the present invention, a semiconductor diode chip to omit the use of an expansion plate and its preparation method are provided wherein the electrodes may be evaported aluminum, nickel, silver or gold plated. After the wafer diffusion is completed to form the P-N junction of the semiconductor wafer, the wafer is cut into a plurality of individual wafer dices. A glass passivation layer is prepared on each single piece of semiconductor rectifier dice by a simplified fixture and is fired separately for forming a passivation coating which sealing the cutting surface of the rectifier dice before the individual semiconductor rectifier chip is metallized to form ohmic contact. Damages to the glass passivation layer during the cutting process in the GPP approach may be avoide, and the manufacture cost needed by semiconductor rectifier may be reduced because it does not require attachment to the expansion plate with 60 mils thickness.

The silicon semiconductor rectifier of this invention may has a positive beveled cut at the cutting surface; the peak reverse voltage being enhanced and the possibility of leakage reduced.

The above and other objects and advantages of this invention may be more clearly understood from the following description by referring to the drawings.

DETAILED DESCRIPTION OF THE INVENTION

Figure 1:
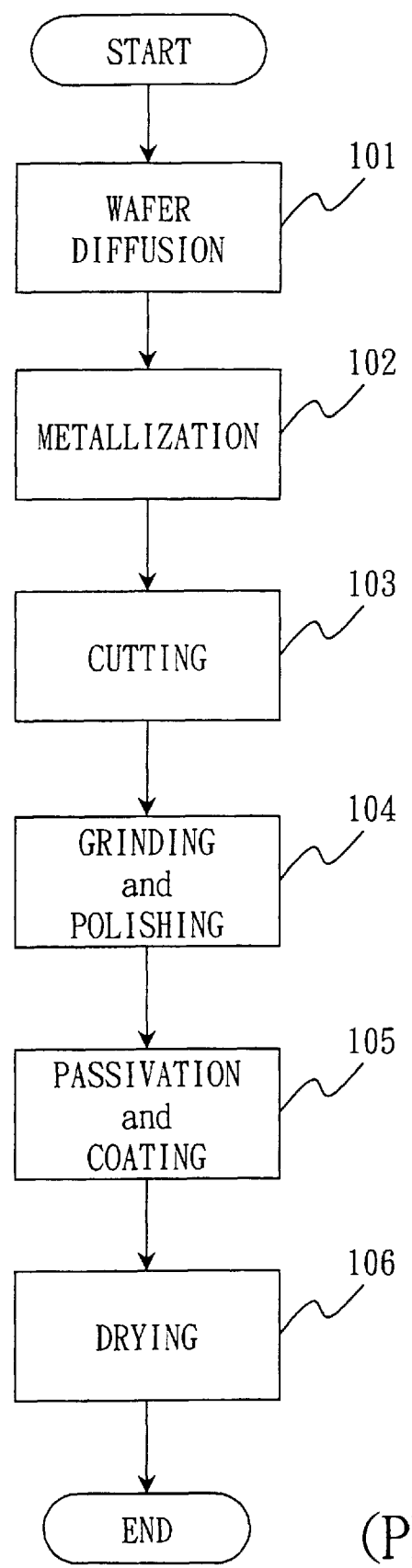
FIG. 1 is a production flow chart for manufacture of a plurality of semiconductor elements from a common wafer of a prior art.
Figure 2:
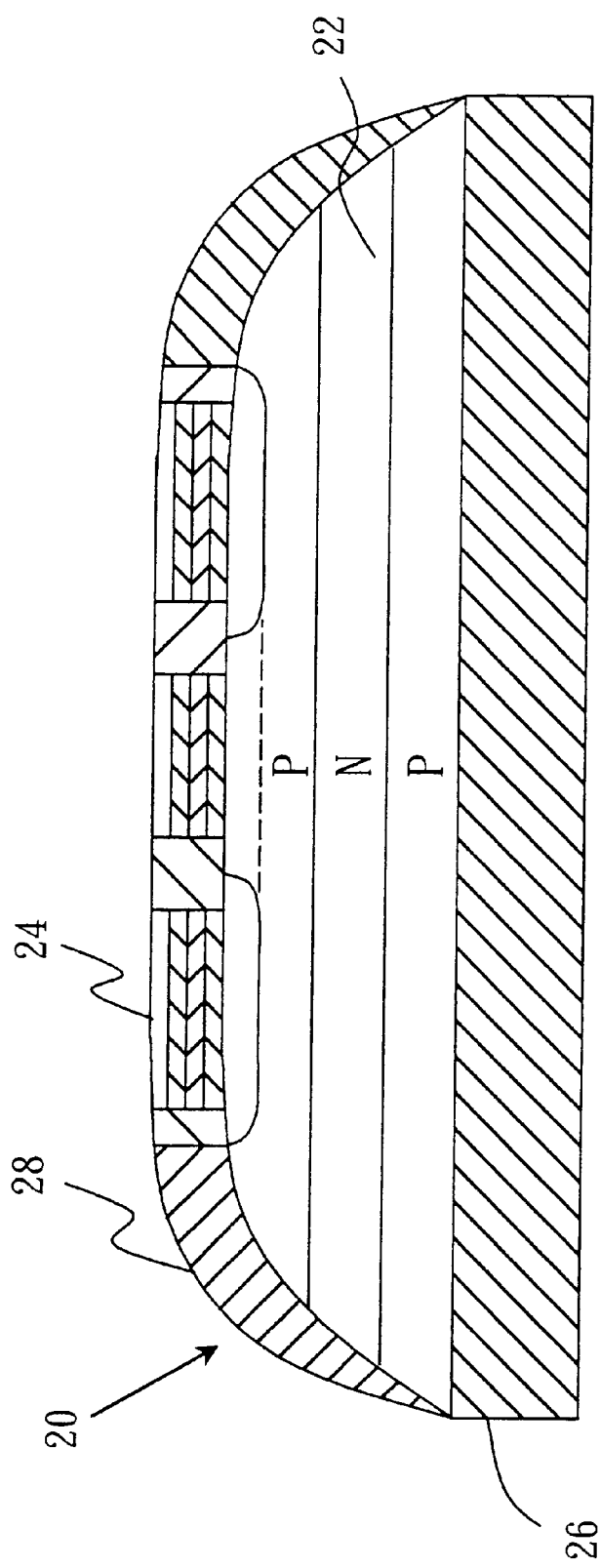
FIG. 2 is a cross-sectional view of a semiconductor element using the apparatus of U.S. Pat. No. 4,638,553.
Figure 3:
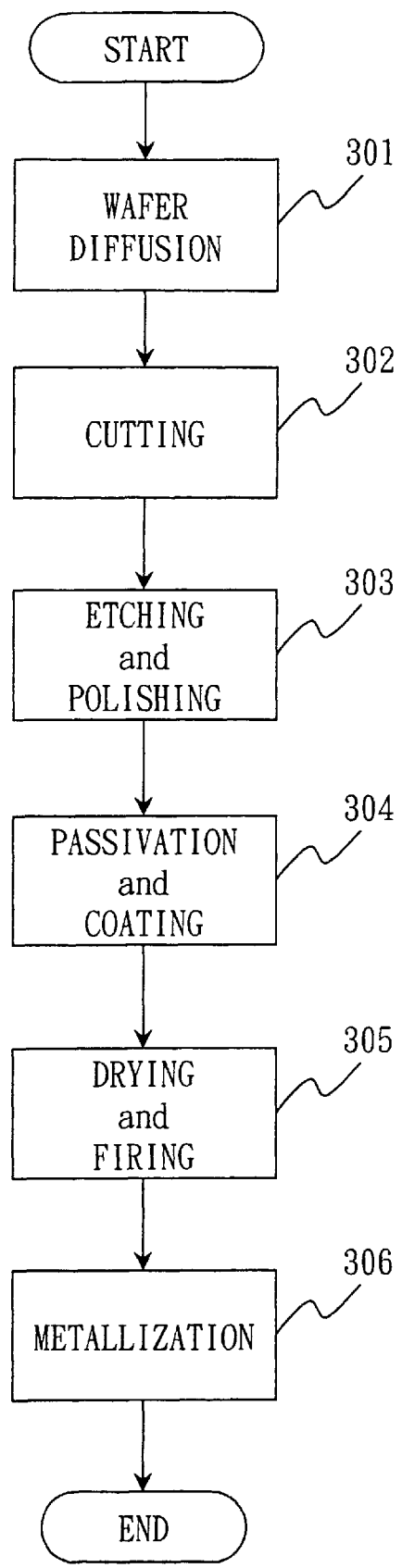
FIG. 3 is a production flow chart for manufacture of a plurality of semiconductor rectifier chips from a common wafer in accordance with the present invention.
Figure 4A:
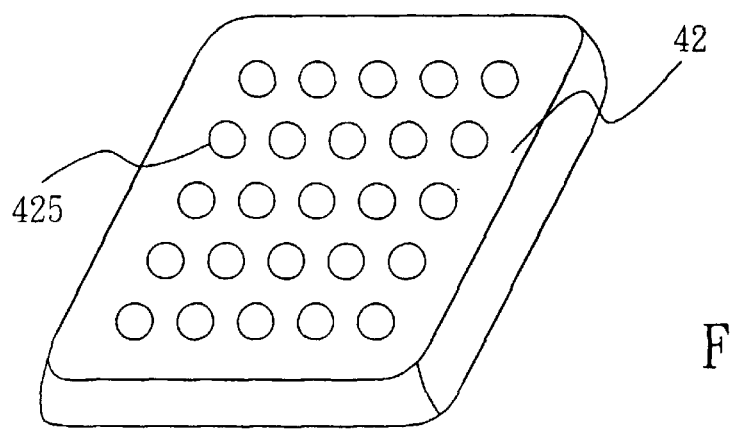
FIGS. 4A to 4C are simplified view of an alternative embodiment of a simplified fixture in accordance with the present invention.
Figure 4B:
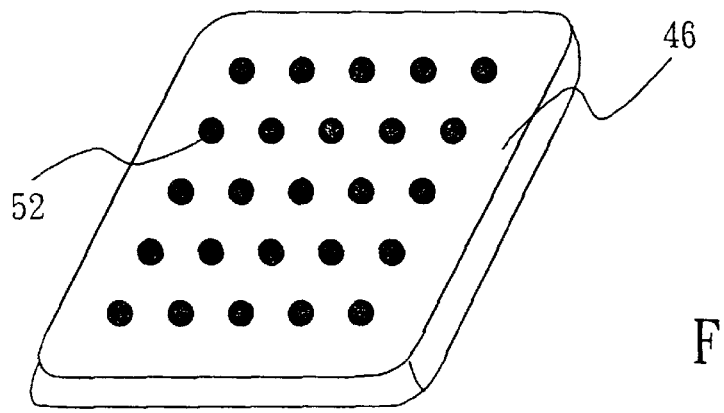
Figure 4C:
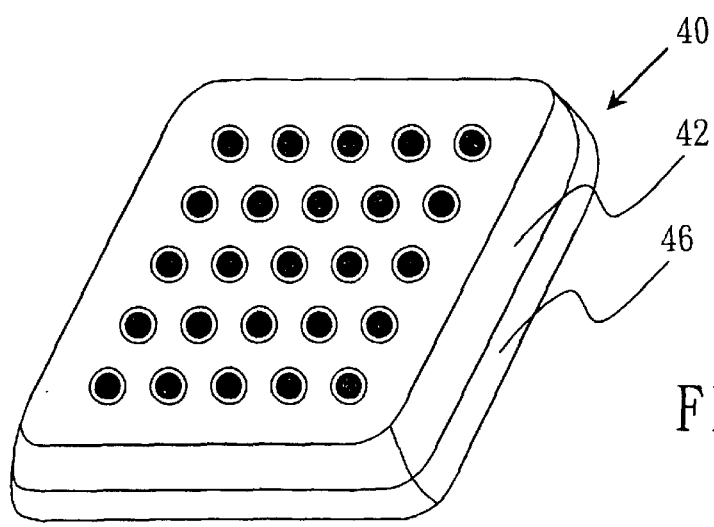

Referring first to FIG. 3, it illustrates a production flow chart for manufacture of a plurality of semiconductor rectifier chips from a common wafer in accordance with the present invention. The followings are description of the processes of the present invention method:

Step 301, a semiconductor wafer is diffused to become $P^+$-N-$N^+$ or $N^+$-P-$P^+$ diffusion wafer with P-N junction by the conventional diffusion process;

Step 302, the diffusion wafer is cut into a plurality of semiconductor dices;

Step 303, the semiconductor dices are chemically etched to dices with a suited shape and smooth cutting surface, treated with chemical polish and oxidation agents to etch off cutting damages and to form a silicon dioxide film by potassium hydroxide, or the composition of hydrofluoric acid and nitric acid;

Step 304, the semiconductor dices are then positioned in a simplified fixture and the cutting surface of the dice is applied with paste of passivation glass powder; (detail shown in FIGS. 4A to 4C)

Step 305, the semiconductor dices with the passivation glass is dried and fired separately to form a vitrified layer; and Step 306, a conventional process is employed for positive and negative electrode metallization processing, that is, the dice is evaporated or plated with metal layer for forming ohmic contact on both sides as electrodes to a semiconductor rectifier chips. The ohmic contact is formed from deposited evaported aluminum, nickel and silver, or gold plating deposited as oxidizing protection layer.

The fixture 40 comprises a base plate 46 with a plurality of locating points (not shown) and a formed plate 42 with a plurality of formed holes 425. The number of formed holes 425 are the same as the number of locating points. The formed hole 425 has the same thickness as the semiconductor dice 52, and has a larger diameter than the semiconductor dice 52.

Then, the manufacturing method of the rectifier chip with the passivation glass is described as following the steps of:

(1) positioning a plurality of semiconductor dice 52 on the locating points of the base plate 46 of the fixture 40 separately;

(2) overlapping the formed plate 42 and the base plate 46 together for sealing the plates;

(3) filling the glass paste of powder material on the face of fixture into the gap between the formed holes 425 and the semiconductor dice 52; for filling out the glass paste, and cleaning the fixture and the glass paste on the dice electrode by scraper;

(4) baking the glass paste to be dried; and (5) separating the formed plate 42 and the base plate 46 to form the assemblies of the cutting surfaces of dice coating with unfired glass after baking.

Then, the rectifier chip with the passivation glass is dried, fired, and metallization processing serially.

Figure 5:
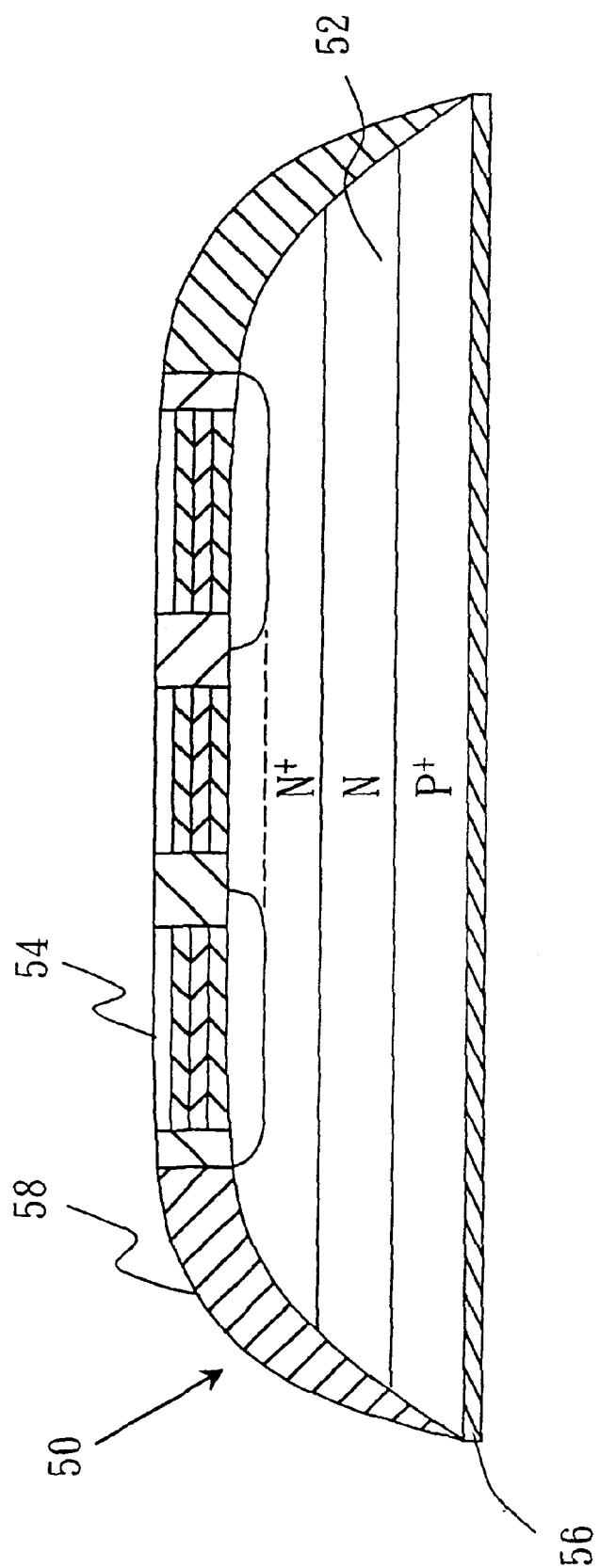
FIG. 5 is a cross-sectional view of a semiconductor rectifier chip using the apparatus of the present invention.
Figure 6:
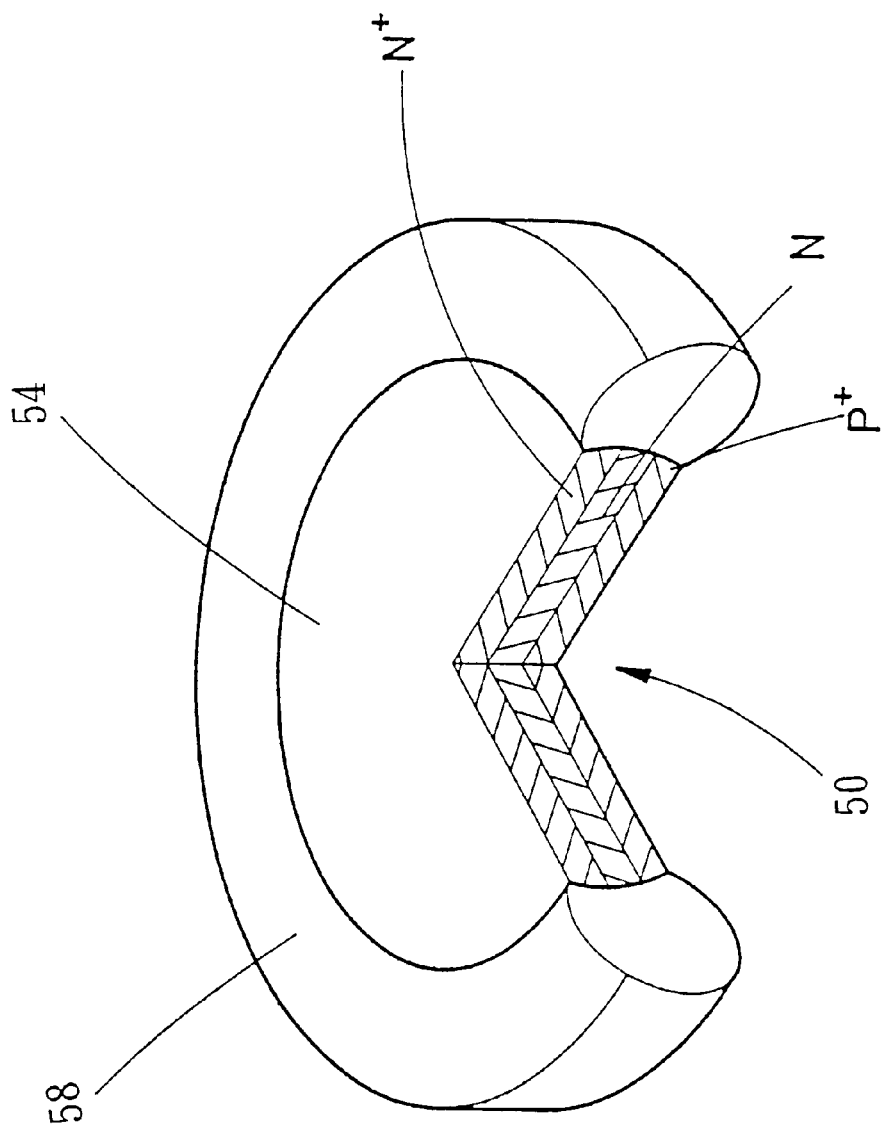
FIG. 6 is an exterior view of the subject invention of a semiconductor rectifier chip in accordance with the present invention.

Furthermore, Referring to FIG. 5 and FIG. 6, they are a cross-sectional view and an exterior view of the subject invention of a semiconductor rectifier chip in accordance with the present invention separately.

Ohmic contact metal film 54, 56 are respectively and simultaneously made on the p+ and N+ electrodes of the semiconductor rectifier chip 50 with a passivation glass 58 to omit the use of the expansion plate.

According to the prior art, it needs to use the expansion plate with a thickness 30 mils as the ohmic contact metal film for one side of the rectifier chip first. After finished one side, it needs to make the ohmic contact metal film for another side. The thickness of the ohmic contact metal film 56 can be made less than 30 mils. Therefore, the procedure of the present invention for making the ohmic contact metal film only one step compared with the prior art. The present invention is advantageous over the method of U.S. Pat. No. 4,638,553 (Nilarp) because it does not require attachment to an expansion plate, namely elimination of the expansion plate attachment step, and yet provides improved sealing of the P-N junction of the rectifier chip 50 through the provision of passivation glass 58 coating which covers the entire cutting surfaces.

Although the present invention has been described in connection with a preferred embodiment thereof, many variations and modifications will now become apparent to those skilled in the art. It is preferred, therefore, that the present invention be limited not by the specific disclosure therein, but only by the appended claims.

What is claimed is:

1. A method of manufacturing a rectifier chip with cutting surface sealed by passivation glass to omit the use of an expansion plate, which method comprising the following steps:

providing a semiconductor wafer with P-N junction;

cutting said wafer to a plurality of semiconductor dices with each of said dices having a cutting surface;

etching and polishing the cutting surface of said dice to dice with a smooth cutting surface and form a silicon dioxide film;

positioning said dices in a simplified fixture respectively and the cutting surface of each of said dices is applied with paste of passivation glass powder, said simplified fixture including a base plate with a plurality of locating points and a formed plate with a plurality of formed holes, the number of said formed holes of said formed plate being the same as the number of said locating points of said base plate.

2. The method of claim 1 wherein said positioning said dices in said simplified fixture, further comprising the steps of:

positioning said dices on the locating points of said base plate separately;

overlapping said base plate and said formed plate together;

filling said passivation glass powder on the face of said fixture into the gap between said formed holes of said formed plate and said dices, and cleaning said fixture and said glass powder on said dice by a scraper; baking said passivation glass powder to be dried; and separating said formed plate and said base plate to form the assemblies of said cutting surfaces of coating with unfired glass after baking.

3. The method of claim 1 wherein said ohmic contact is formed from evaporated aluminum.

4. The method of claim 1 wherein said ohmic contact is formed from plated nickel, silver, or gold.

* * * * *